United States Patent
Huang

(10) Patent No.: US 7,653,353 B2
(45) Date of Patent: Jan. 26, 2010

(54) RECEIVER IC WITH SAW-BASED OSCILLATOR

(75) Inventor: Ching-Hsing Huang, Hsinchu (TW)

(73) Assignee: Princeton Technology Corporation, Taipei County (TW)

( * ) Notice: Subject to any disclaimer, the term of this patent is extended or adjusted under 35 U.S.C. 154(b) by 474 days.

(21) Appl. No.: 11/638,523

(22) Filed: Dec. 14, 2006

(65) Prior Publication Data

US 2008/0090543 A1    Apr. 17, 2008

(30) Foreign Application Priority Data

Oct. 12, 2006    (TW) ................ 095137523 A

(51) Int. Cl.
  *H04B 7/00*    (2006.01)
  *H04B 1/16*    (2006.01)
(52) U.S. Cl. .............. 455/41.2; 455/41.3; 455/334
(58) Field of Classification Search ............ 455/41.2, 455/41.3, 147, 208, 255, 130, 134, 161.1, 455/161.3, 226.2; 331/158, 116 FE
See application file for complete search history.

(56) References Cited

U.S. PATENT DOCUMENTS

| | | | | |
|---|---|---|---|---|
| 5,978,664 A | * | 11/1999 | Janssen | .............. 455/226.2 |
| 7,183,868 B1 | * | 2/2007 | Wessendorf | .............. 331/158 |
| 7,327,806 B2 | * | 2/2008 | Liem et al. | .............. 375/322 |
| 2008/0090530 A1 | * | 4/2008 | Huang | .............. 455/118 |
| 2009/0058546 A1 | * | 3/2009 | Yajima | .............. 331/116 FE |

* cited by examiner

*Primary Examiner*—Sonny Trinh
(74) *Attorney, Agent, or Firm*—Muncy, Geissler, Olds & Lowe, PLLC

(57) ABSTRACT

A receiver IC provided with a SAW-based oscillator with an external SAW device. The receiver IC comprises an oscillating circuit. The oscillating circuit comprises an inverter stage, a first capacitor, a second capacitor, and a resistor. The inverter stage has input and output terminals respectively coupled to two ends of the external SAW device. The first and second capacitors are respectively coupled between the input/output terminal and a ground. The resistor is coupled between the input and output terminals of the inverter stage.

10 Claims, 2 Drawing Sheets

RECEIVER IC WITH SAW-BASED OSCILLATOR

BACKGROUND OF THE INVENTION

1. Field of the Invention

The invention relates to a receiver and, in particular, to a receiver IC with a SAW-based oscillator.

2. Description of the Related Art

In wireless communication, radio frequency integrated circuits (RFICs) are used in keyless entry systems, remote control systems, alarm systems, security systems, wireless sensors and the like. A receiver is an indispensable element in an RFIC.

A receiver typically comprises a local oscillator. The local oscillator generates a signal which is injected into a mixer along with a signal from an antenna. Thus, signals with frequencies equivalent to sum and difference in frequencies of the injected signals are generated by syperheterodyne. A frequency of one of the signals from the mixer falls in an intermediate frequency (IF) band. The signal in the IF band is processed by a demodulator and an output signal is generated.

BRIEF SUMMARY OF THE INVENTION

An embodiment of a receiver IC associated with an external SAW device comprises an oscillating circuit. The oscillating circuit comprises an inverter stage, a first capacitor, a second capacitor, and a resistor. The inverter stage has input and output terminals respectively coupled to two ends of the external SAW device. The first and second capacitors are respectively coupled between the input/output terminal and a ground. The resistor is coupled between the input and output terminals of the inverter stage.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
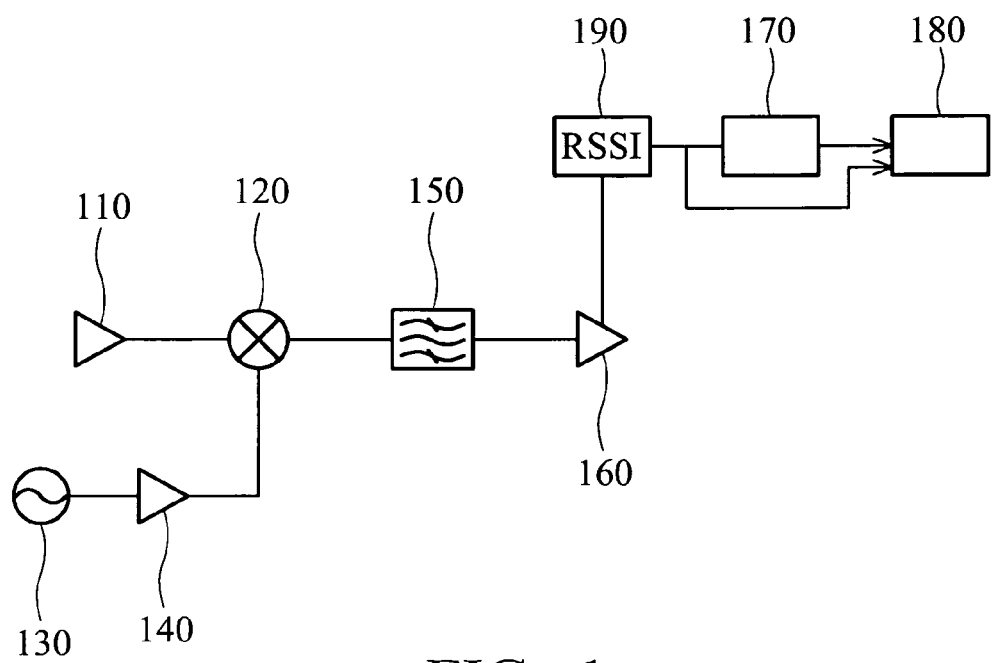
FIG. 1 is a block diagram of a receiver IC with a SAW-based oscillator according to an embodiment of the invention.

FIG. 1 is a block diagram of a receiver IC with a SAW-based oscillator according to an embodiment of the invention. The receiver IC comprises a first amplifier 110, a mixer 120, a local oscillator (LO) 130, a buffer 140, a filter 150, a second amplifier 160, and a received signal strength indicator (RSSI) 190. The mixer 120 is coupled to the first amplifier 110 and the local oscillator 130. The filter 150 is coupled to the mixer 120. The second amplifier 160 is coupled to the filter 150. The RSSI 190 is coupled to the second amplifier 160. In an embodiment, the first amplifier 110 is a low noise amplifier.

The filter 150 is an intermediate frequency (IF) low pass filter. The second amplifier 160 is an IF amplifier. After the LNA received an RF signal, the RF signal and an oscillating signal from the local oscillator 130 (via the buffer 140) are mixed by the mixer 120 and a mixed signal is generated. The mixed signal is filtered by the IF low pass filter and an intermediate frequency (IF) signal is generated. The IF signal is amplified by the IF amplifier and an amplified signal is generated. The RSSI 190 generates an output signal by retrieving data from the IF signal according to the amplified signal. In addition, the receiver IC further comprises a peak detector 170 and a data slicer 180. The peak detector 170 is coupled to the RSSI 190 and generates a DC voltage proportional to a peak of the received data signal. The data slicer 180 is coupled to the RSSI 190 and generates a digital data signal for further processing. In an embodiment, the data slicer is coupled to the peak detector.

Figure 2:
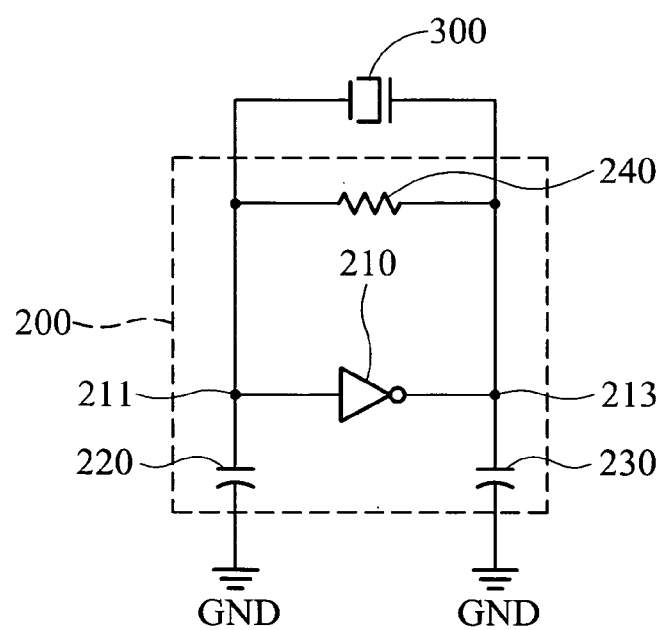
FIG. 2 is a circuit diagram of the local oscillator 130 in FIG. 1.

FIG. 2 is a circuit diagram of the local oscillator 130 in FIG. 1. The local oscillator is a surface acoustic wave (SAW)-based oscillator. The SAW-based oscillator comprises an oscillating circuit 200. The oscillating circuit 200 comprises an inverter stage 210, first and second capacitors 220 and 230, and a resistor 240. The inverter stage 210 has an input terminal 211 and an output terminal 213 respectively coupled to one and the other ends of a SAW device 300. In the embodiment, the SAW device is a SAW resonator. The first capacitor 220 is coupled between the input terminal 211 of the inverter stage 210 and a ground GND and the second capacitor 230 coupled between the output terminal 213 of the inverter stage 210 and the ground GND. The resistor 240 is coupled between the input terminal 211 and the output terminal 213 of the inverter stage 210. An output signal at the output terminal 213 is an inverse of an input signal at the input terminal 211. Preferably, the inverter stage 210 comprises three inverters connected in series. However, the number of inverters is not limited thereto and more than three can be applied in the inverter stage 210 in a receiver IC with a SAW-based oscillator according to the invention.

Figure 3:
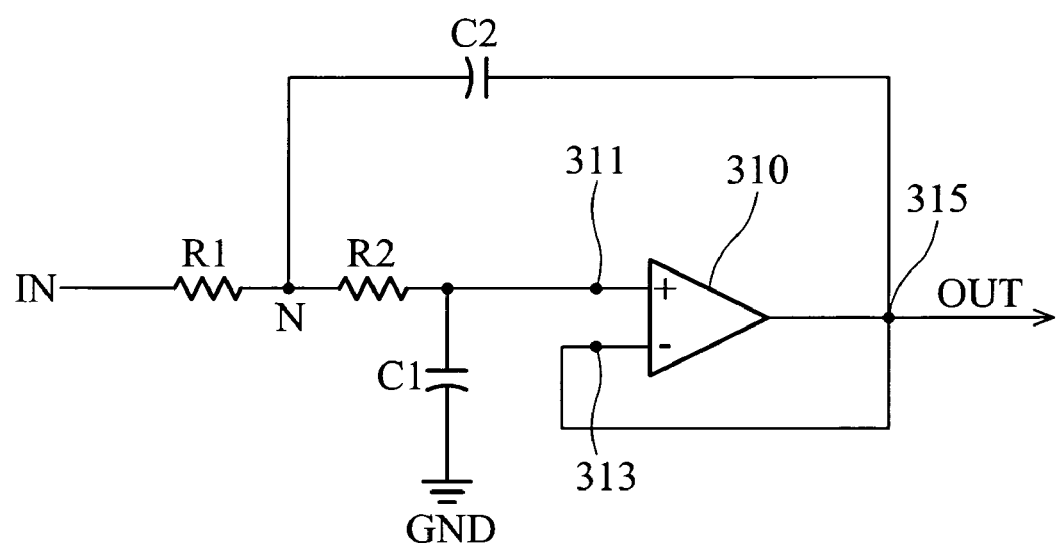
FIG. 3 is a circuit diagram of the IF low pass filter 150 in FIG. 1

Referring to FIGS. 1 and 3, FIG. 3 is a circuit diagram of the second filter (IF low pass filter) 150 in FIG. 1. The second filter 150 is substantially a Sallen-Key filter comprising an operational amplifier 310, first and second resistors R1 and R2, and first and second capacitors C1 and C2. The second filter 150 has an input terminal IN coupled to the mixer 120 and an output terminal OUT coupled to eh second amplifier (IF amplifier) 160. The operational amplifier 310 has an inverting terminal 313 coupled to an output terminal 315 thereof. The first capacitor C1 is coupled to a non-inverting terminal 311 of the operational amplifier 310 and the ground GND. The first and second resistors R1 and R2 are connected in series between the input terminal IN and the non-inverting terminal 311 of the operational amplifier 310. There is a node N between the first and second resistors R1 and R2. The second capacitor C2 is coupled to the node N and the output terminal 315 of the operational amplifier 310.

In a remote control door opening system, a signal generated by a remote controller suffers frequency drift after a long time. If a bandwidth of a pass band of the IF low pass filter in a receiver IC is narrow (hundreds of KHz), the signal generated by the remote controller is removed by the IF low pass filter and the receiver cannot receive the signal generated by the remote controller. Thus, the remote control system cannot work properly. According to an embodiment of the invention, a bandwidth of the pass band of the IF low pass filter ranges from 1.5 MHz to 4 MHz. In an embodiment, the bandwidth of the IF low pass filter is set as 3 MHz. Since the bandwidth of the IF low pass filter is widened, the signal generated by the remote controller is not removed by the IF low pass filter even in the event of frequency drift therein. As a result, the receiver IC receives the signal generated by the remote controller. Preferably, a center frequency of the pass band of the IF low pass filter 150 ranges from 1 MHz to 3 MHz. In an embodiment, the center frequency of the pass band of the IF low pass filter 150 is 1.8 MHz.

While the invention has been described by way of example and in terms of preferred embodiment, it is to be understood that the invention is not limited thereto. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A receiver IC associated with an external SAW device, comprising:
   an oscillating circuit, comprising:
      an inverter stage having an input terminal and an output terminal respectively coupled to one and the other ends of the external SAW device;
      a first capacitor coupled between the input terminal of the inverter stage and a ground;
      a second capacitor coupled between the output terminal of the inverter stage and the ground; and
      a resistor coupled between the input and output terminals of the inverter stage;
   a first amplifier receiving an RF signal;
   a mixer coupled to the first amplifier and the oscillating circuit and mixing the RF signal and an oscillating signal to generate a mixed signal;
   a filter coupled to the mixer and filtering the mixed signal to generate an IF signal;
   a second amplifier coupled to the filter and amplifying the IF signal to generate an amplified signal; and
   a received signal strength indicator (RSSI) coupled to the second amplifier and generating an output signal according to the amplified signal.

2. The receiver IC as claimed in claim 1, wherein bandwidth of a pass band of the filter ranges from 1.5 MHz to 4 MHz.

3. The receiver IC as claimed in claim 2, wherein a center frequency of the pass band of the filter ranges from 1 MHz to 3 MHz.

4. The receiver IC as claimed in claim 1, further comprising a buffer coupled between the mixer and the oscillating circuit.

5. The receiver IC as claimed in claim 1, wherein the first amplifier is a low noise amplifier (LNA).

6. The receiver IC as claimed in claim 1, wherein the filter is an intermediate frequency (IF) low pass filter.

7. The receiver IC as claimed in claim 1, wherein the second amplifier is an IF amplifier.

8. The receiver IC as claimed in claim 1, wherein the inverter stage comprises three inverters.

9. The receiver IC as claimed in claim 1, further comprising a peak detector coupled to the RSSI and generating a DC voltage proportional to a peak of a received data signal.

10. The receiver IC as claimed in claim 1, further comprising a data slicer coupled to the RSSI and generating a digital output signal.

* * * * *